US009831193B1

(12) United States Patent
Jackson et al.

(10) Patent No.: US 9,831,193 B1
(45) Date of Patent: Nov. 28, 2017

(54) METHODS AND APPARATUS FOR SCRIBE STREET PROBE PADS WITH REDUCED DIE CHIPPING DURING WAFER DICING

(71) Applicant: Texas Instruments Incorporated, Dallas, TX (US)

(72) Inventors: Ricky Alan Jackson, Richardson, TX (US); Erika Lynn Mazotti, San Martin, CA (US); Sudtida Lavangkul, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 4 days.

(21) Appl. No.: 15/169,700

(22) Filed: May 31, 2016

(51) Int. Cl.
H01L 23/528 (2006.01)
H01L 23/00 (2006.01)
H01L 23/544 (2006.01)
H01L 23/31 (2006.01)
H01L 21/66 (2006.01)
H01L 21/78 (2006.01)

(52) U.S. Cl.
CPC .......... *H01L 23/562* (2013.01); *H01L 21/78* (2013.01); *H01L 22/32* (2013.01); *H01L 23/3171* (2013.01); *H01L 23/544* (2013.01); H01L 2223/5446 (2013.01)

(58) Field of Classification Search
None
See application file for complete search history.

(56) References Cited

U.S. PATENT DOCUMENTS

| 6,521,975 B1 | 2/2003 | West et al. |
| 8,125,053 B2 | 2/2012 | West et al. |
| 8,309,957 B2 | 11/2012 | Chatterjee et al. |
| 9,054,104 B2 * | 6/2015 | Kim ............... H01L 23/3192 |
| 9,659,886 B2 * | 5/2017 | Lin ..................... H01L 24/05 |
| 2005/0179114 A1 * | 8/2005 | Satake ............... H01L 22/32 257/626 |
| 2012/0091455 A1 * | 4/2012 | Chen ................. H01L 22/32 257/48 |
| 2015/0054129 A1 * | 2/2015 | Saigoh .............. H01L 23/3157 257/532 |
| 2015/0200158 A1 * | 7/2015 | Okumura ........... H01L 23/5226 257/368 |

* cited by examiner

*Primary Examiner* — Ali Naraghi
(74) *Attorney, Agent, or Firm* — Jacqueline J. Garner; Charles A. Brill; Frank D. Cimino

(57) ABSTRACT

An example apparatus includes a semiconductor wafer with a plurality of probe pads each formed centered in scribe streets and intersected by saw kerf lanes. Each probe pad includes a plurality of lower level conductor layers arranged in lower level conductor frames, a plurality of lower level vias extending vertically through lower level insulator layers and electrically coupling the lower level conductor frames; a plurality of upper level conductor layers, each forming two portions on two outer edges of the probe pad, the two portions aligned with, spaced from, and on opposite sides of the saw kerf lane, the coverage of the upper level conductor layers being less than about twenty percent; and a plurality of upper level vias extending vertically through upper level insulator layers and coupling the upper level conductor layers electrically to one another and to the lower level conductor layers. Methods are disclosed.

8 Claims, 14 Drawing Sheets

METHODS AND APPARATUS FOR SCRIBE STREET PROBE PADS WITH REDUCED DIE CHIPPING DURING WAFER DICING

TECHNICAL FIELD

This application relates generally to the use of probe and bond pads in scribe streets in semiconductor device and integrated circuit manufacture, and more particularly to probe pads in scribe streets designed to reduce die chipping effects during wafer dicing operations.

BACKGROUND

Integrated circuits are produced as a plurality of dies on a semiconductor wafer. The semiconductor wafer is subjected to various processing steps, including: forming active areas within the semiconductor material by use of doping and ion implantation; deposition and patterning of insulator layers; and forming conductor layers such as metallic layers. The insulator layers are formed over the semiconductor substrate, and are also formed between and surrounding conductor layers and over the entire structure to provide electrical insulation between layers of conductors. The conductor layers include materials such as doped polysilicon, aluminum, and copper conductor layers. Another insulator layer is formed over the entire device and is referred to as the "passivation layer" or sometimes referred to as a "protective overcoat" or "PO" layer. The passivation layer provides electrical insulation as well as protection from moisture and other impurities that can corrode or adversely affect the conductors and the semiconductor substrate. The insulator layers are thin, brittle layers of materials that can be sometimes be considered ceramic materials, such as silicon dioxide, silicon nitride, silicon oxynitride, silicon carbide, and polyimide.

After the integrated circuits are completely manufactured but while the integrated circuits still reside on a single semiconductor wafer, the devices are separated one from another. This operation is referred to as "singulation" or "dicing" of the semiconductor wafer. Singulation of integrated circuit devices from a semiconductor wafer includes physically separating the devices by a sawing or scribing operation. Mechanical sawing or laser sawing is used to saw through the semiconductor wafer in kerf lanes or scribe street areas that are defined between the integrated circuit dies. Sometimes the separation is performed by laser scribing followed by a mechanical breaking operation along a scribed area.

Because the scribe street areas are portions of the semiconductor wafer that are subjected to the same processing steps and conditions as the integrated circuit dies, and which can contain conductors and insulators as well as active areas on the semiconductor wafer, test structures are often formed in the scribe streets. These test structures can be used to characterize the expected performance of the integrated circuit dies prior to completing the manufacturing process. If the tests on the structures in the scribe streets indicate that the expected performance of the integrated circuit dies formed on the semiconductor wafer does not meet or exceed the requirements for the devices, the remaining manufacturing steps, including the use of expensive test and packaging equipment, and the use of various packaging materials, bond wires, solder balls and so forth can be saved. If the integrated circuit devices on the semiconductor wafer cannot meet the necessary performance requirements, the costs of completing these devices can be avoided. In addition, by using the test structures in the scribe streets, useful parametric information can be gathered about the devices on the semiconductor wafer without possibly damaging the bond pads in the finished integrated circuit dies. For example, parametric information on materials such as conductivity/permittivity, transistor threshold voltages, device speed and device power consumption can be obtained using test structures formed in the scribe lane areas.

Testing can be done using a wafer probe card with fine probe needles making electrical contact to bond pads or probe pads for the test structures formed in the scribe streets. Once the semiconductor wafer is diced into individual integrated circuit dies using the kerf lanes in the scribe street areas, these test structures will be destroyed.

When the semiconductor wafer is sawed, chipping of the semiconductor wafer can occur. In a mechanical dicing operation, a rotating saw blade has to cut through the insulating layers, the conductor layers, and through the semiconductor wafer. When thick metal structures are present in the saw kerf lane where the saw blade enters the semiconductor wafer, chipping problems are increased. The metal can also clog the teeth in the saw blade, causing damage to the tool and to the semiconductor wafer. The saw blade has significant vibration and heat is generated while the saw blade is rotating and cutting through these mechanically brittle layers. Use of thick metal layers to form bond or probe pads in the saw kerf lane has resulted in increased chipping and unwanted cracking in the semiconductor wafer during sawing.

Laser cutting can also be used to separate the wafer into individual integrated circuit dies. In one approach a laser is used to scribe trenches into the surface of the wafer, and the wafer is then broken mechanically along the cuts. In other approaches the laser is used to cut through the semiconductor wafer. In either of these laser dicing approaches, cracks and chipping in the semiconductor wafer can occur. These chipping and cracking problems are increased with increased metal density in the saw kerf lanes.

U.S. Pat. No. 8,309,957, filed Apr. 13, 2010, issued Nov. 13, 2012, entitled "Replacement of Scribeline Padframe with Saw-Friendly Design," listing Chatterjee et. al. as inventors, which is co-owned with the present application and which is hereby incorporated by reference in its entirety herein, discloses reduced metal density in scribe probe pads.

SUMMARY

In described examples, an apparatus includes a semiconductor wafer with a plurality of probe pads each formed centered in scribe streets and intersected by saw kerf lanes. Each probe pad includes a plurality of lower level conductor layers arranged in lower level conductor frames, a plurality of lower level vias extending vertically through lower level insulator layers and electrically coupling the lower level conductor frames; a plurality of upper level conductor layers, each forming two portions on two outer edges of the probe pad, the two portions aligned with, spaced from, and on opposite sides of the saw kerf lane, the coverage of the upper level conductor layers being less than about twenty percent; and a plurality of upper level vias extending vertically through upper level insulator layers and coupling the upper level conductor layers electrically to one another and to the lower level conductor layers. An opening in a passivation layer overlying the scribe street exposes the uppermost upper conductor layer in the probe pad and a conductive material deposited in the opening forms an upper probe pad surface layer,

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

The term "scribe street" includes similar terms such as "scribe lane" and "scribe line" and refers to areas on a semiconductor wafer between adjacent integrated circuit dies that are set aside for physically separating the integrated circuit dies. In a mechanical sawing operation, a saw kerf lane is positioned centrally in the scribe street. The laser or saw blade traverses the saw kerf lane during singulation. The material in the saw kerf lane is destroyed during the mechanical sawing operation and is then lost. In a mechanical sawing operation, the saw kerf lane is somewhat wider than the width of the saw blade, as the saw blade vibrates and wobbles during sawing and removes material to a width that is wider than the saw blade.

Figure 1:
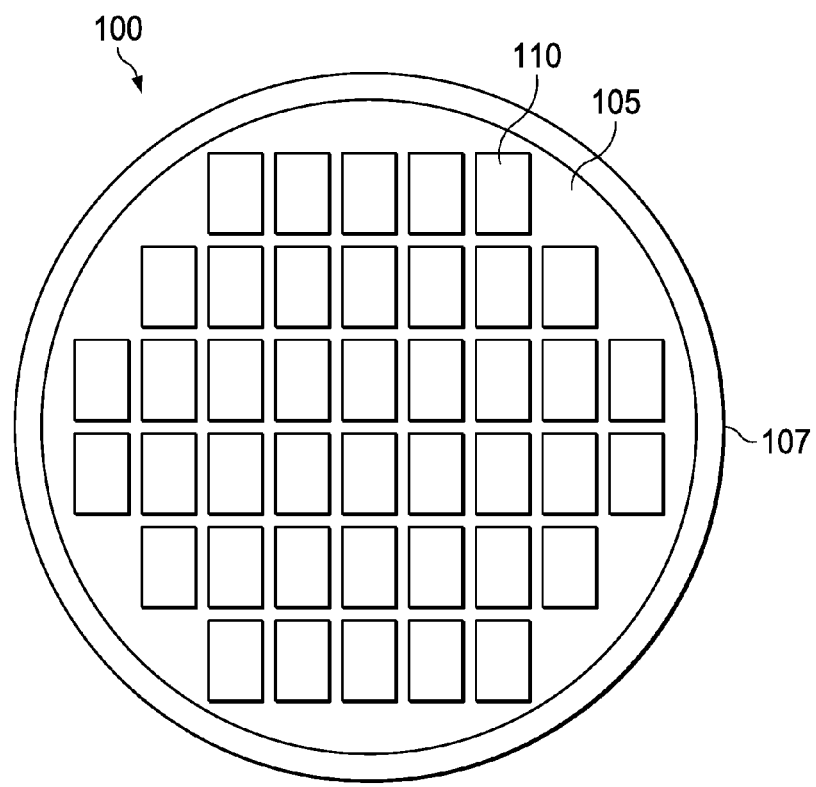
FIG. 1 illustrates a semiconductor wafer and integrated circuit dies.

FIG. 1 depicts in a plan view 100 a semiconductor wafer 105 having a plurality of integrated circuit dies 110 formed on the semiconductor wafer 105. The semiconductor wafer is shown arranged on a wafer support or frame 107. Not visible in this view is a supporting backing material referred to as "dicing tape" which lies beneath and is adhered to the semiconductor wafer 105. During a dicing operation the dicing tape supports and stabilizes the integrated circuit dies 110. As the semiconductor wafer is cut or sawed through, the integrated circuit dies remain in position, are physically supported by the wafer dicing tape, and do not fall away from the support 107. Pick and place or other die handling equipment can then be used to remove the integrated circuit dies from the wafer dicing tape after the integrated circuit dies have been sawed apart. The integrated circuit dies 110 are then processed further and eventually are packaged to form completed integrated circuit devices.

Each of the integrated circuit dies 110 can include active devices such as transistors, diodes and similar devices formed on the semiconductor substrate 105. The active devices are formed in active areas of the semiconductor wafer. Active areas are areas formed using ion implantation and impurity doping techniques to become p type and n type doped areas. These p type and n type doped areas can be used to form: transistors such as bipolar transistors, metal oxide semiconductor (MOS) field effect transistors (MOSFETs); diodes; silicon controlled rectifiers; and other devices that conduct current in response to a voltage or current. Passive devices can be formed on the semiconductor wafer, including: capacitors; resistors; and inductors. The passive devices can be formed either using the substrate material or in layers formed over the substrate. Sensors such as fluxgate sensors, current sensors, photosensors, temperature sensors and other sensors can be formed using the active areas and the layers formed over the substrate. In an example a fluxgate sensor is formed on the integrated circuit dies. A fluxgate sensor includes a magnetic core material including iron wrapped in a conductive coil. When completed, the integrated circuit dies 110 each form a complete circuit that performs a desired function. The circuit is formed by coupling the transistors, resistors, capacitors, diodes, sensors etc. together and to input terminals for receiving signals and power. The integrated circuit dies 110 can also have output terminals for outputting signals. The integrated circuit dies 110 can form circuits such as: transistors; digital circuits such as logic gates; analog circuits such as rectifiers; controllers such as microcontrollers; processors such as digital signal processors or central processing units; non-volatile storage devices such as FLASH devices; memory devices such as static random access memory (SRAM) devices or dynamic random access memory (DRAM) devices; integrated sensor devices, or other integrated circuit devices. Each of the integrated circuit dies 110 on a semiconductor wafer 105 can be an identical integrated circuit. Integrated circuits can include a few, many thousands, or even millions of devices.

Figure 2:
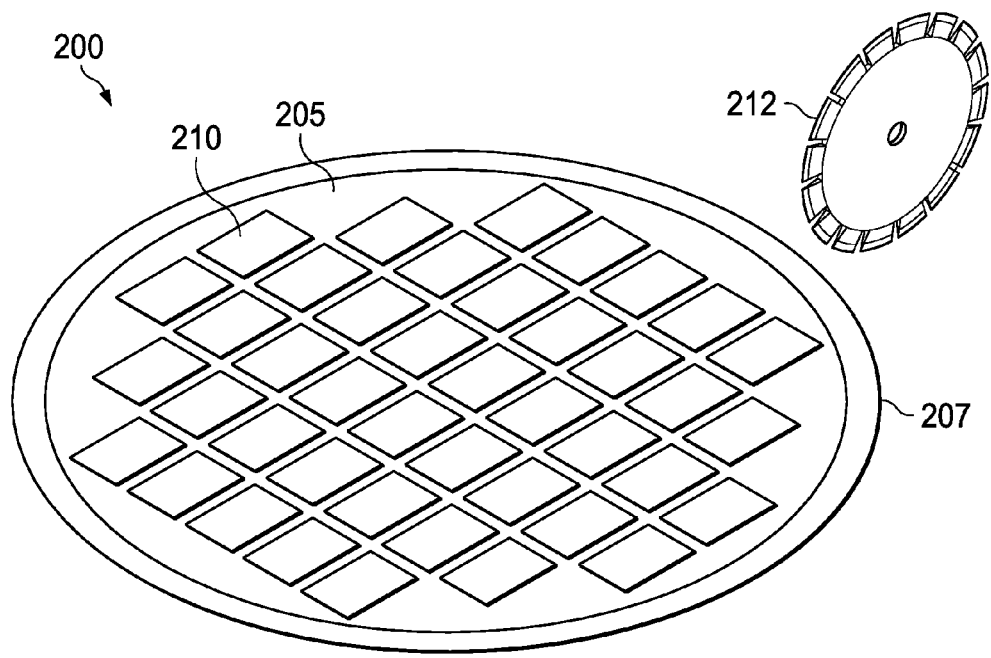
FIG. 2 illustrates a semiconductor wafer and a wafer dicing saw.

FIG. 2 illustrates in another plan view 200 a semiconductor wafer 205 shown in a mechanical sawing operation. In FIG. 2, similar reference labels are used for those elements that correspond to the elements of FIG. 1, except that the reference labels begin with the digit "2" in FIG. 2, for convenience. In FIG. 2, semiconductor wafer 205 is shown including a number of integrated circuit dies 210. A support 207 provides mechanical support for the semiconductor wafer 205. A saw blade 212 is shown being applied to the top surface of the semiconductor wafer 205. The saw blade 212 will saw through the semiconductor wafer 205 in defined saw kerf lanes that are positioned in scribe streets between the integrated circuit dies 210. The saw kerf lanes of the scribe streets are areas that will be removed during the sawing operation and so any circuitry positioned there will be destroyed. Test circuitry and certain structures that can be used to characterize the material properties of the semiconductor wafer prior to dicing can be formed in the scribe streets. Probe pads formed in the scribe streets provide electrical contact to the test structures. The probe pads can be used in a test operation by applying a probe needle to make electrical contact to the probe pad. After the wafer dicing is completed, these test structures may be destroyed and are therefore no longer available.

Figure 3:
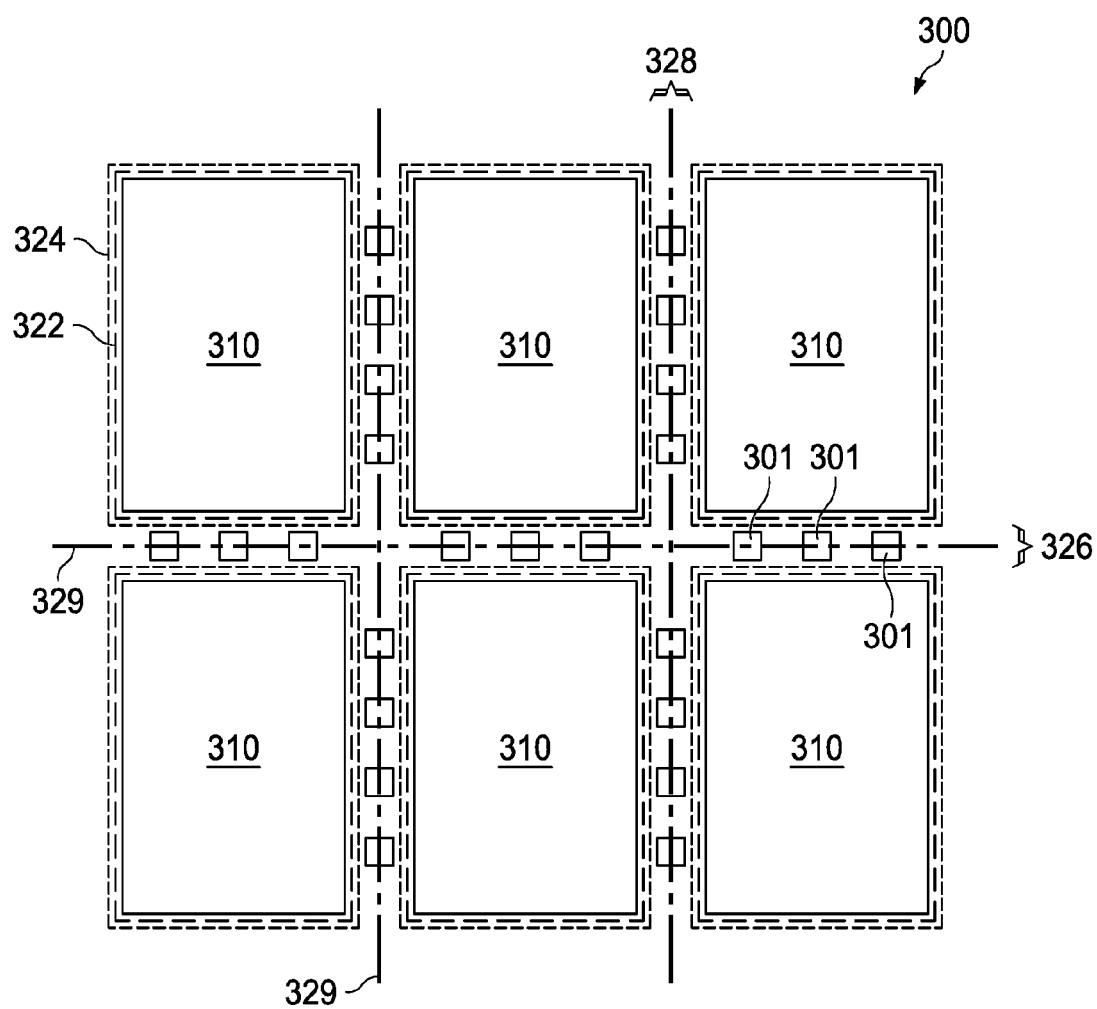
FIG. 3 illustrates in a plan view a portion of a semiconductor wafer and integrated circuit dies with scribe streets and probe pads.

FIG. 3 depicts in a plan view 300 a portion of a conventional semiconductor wafer having a number of integrated circuit dies 310 formed on it. Areas 326 and 328 are scribe streets including saw kerf lanes 329 for sawing the integrated circuit dies 310 apart in a dicing operation. The scribe streets have a width which can vary from about forty microns to over one hundred microns. In an example, the scribe streets are about eighty microns wide. Using less area of the semiconductor wafer for the scribe street areas is desired, because using a lower area for the scribe street areas leaves more semiconductor wafer area for forming additional integrated circuit dies, lowering the cost per integrated circuit. Kerf lanes 329 are shown in the central portion of the scribe streets 326 and 328 and these kerf lanes identify the places where the saw will cut through the insulator layers overlying the semiconductor wafer. The saw blade will also cut through the semiconductor wafer entirely to physically separate the integrated circuit dies from one another.

In FIG. 3, each integrated circuit die 310 is surrounded by a conventional scribe seal 322. The scribe seal includes the insulator layers and the conductor layers that are also used in forming the insulators and conductors within the integrated circuit dies 310. The conductor layers of the scribe seal are formed simultaneously with the integrated circuit conductor layers. The insulator layers that lie between and around the conductor layers within the integrated circuit dies 310 are also formed in the scribe seal 322. The scribe seals are arranged between the scribe streets 326 and the integrated circuit dies 310 and the scribe seals surround the integrated dies 310. The scribe seals are intended to reduce or prevent cracks formed in the insulator layers during dicing in the scribe streets 326, 328 during sawing or scribing from propagating into the integrated circuit dies 310. The propagation of cracks that begins during the dicing operation is addressed by forming metal structures that extend vertically through and interrupt the continuity of the brittle insulator layers. By interrupting the insulator layers, the scribe seal is arranged to prevent or to stop a crack from traversing the scribe seal structure.

In FIG. 3, each integrated circuit die 310 includes a crack arrest structure 324. The scribe seals 322 surround each integrated circuit die and are placed between the scribe street and the interior of the integrated circuit dies and extend around the periphery of the integrated circuit dies 310. The crack arrest structures 324 also surround each integrated circuit die 310 and are positioned outside the scribe seal 322 for each integrated circuit die 310. The crack arrest structures 324 form a periphery around the scribe seal 322 for each integrated circuit die 310. The crack arrest structures 324 are added to provide additional crack prevention. The crack arrest structures prevent cracks in the insulator or passivation layers from propagating from the scribe streets into the integrated circuit dies 310.

U.S. Pat. No. 8,125,053, entitled "Embedded Scribe Lane Crack Arrest Structure for Improved IC Package Reliability of Plastic Flip-Chip Devices," filed Feb. 4, 2004, issued Feb. 28, 2012, listing West et. al. as inventors, which is co-owned with the present application, and which is hereby incorporated by reference in its entirety herein, discloses adding crack arrest structures between the scribe streets and the scribe seals to further prevent crack propagation from the scribe line area.

In FIG. 3, the scribe streets include probe pads 301. These conductive pad areas are formed entirely within the scribe streets and are intersected by the saw kerf lanes 329. The conductive probe pads provide electrical connection to a test apparatus by providing a conductive path to test structures formed within the scribe streets. The probe pads 301 can be arranged to supply power to a test structure, as an input terminal of a test structure, or as an output terminal for a test structure. During wafer level test operations, a probe card will be positioned in proximity to the semiconductor wafer, and conductive needles will make physical and electrical contact to the probe pads 301.

The semiconductor wafer can be of any one of several known semiconductor materials including silicon, gallium, gallium arsenide, silicon germanium, and other III-V compounds. These materials are all fairly brittle. The insulator layers can be any of the insulator materials used in semiconductor processing, including: silicon dioxide, silicon nitride, silicon oxynitride, silicon carbide, doped glass such as boron-silicate glass, phosphor silicate glass, undoped silicate glass, fluoro-silicate glass, tetraethyl ortho-silicate oxide (TEOS), and silicon containing hydrogen silsesquioxane. Gels and organics can be used, such as polyimides, organic polymerics, and foams.

The mechanical sawing operations use a saw blade that is made of steel or titanium alloys with diamond material at the cutting surface. When the semiconductor wafers are cut, a portion of the scribe street material remains with the integrated circuit dies including the scribe seal area. The conductor layers can include aluminum and its alloys, and copper and its alloys, as well as other conductive material such as doped polysilicon. When thick conductor materials such as copper are included in the probe pad areas, the saw blade has to saw through these thick layers. The thick metal material can clog the saw tool, causing damage to the tool and to the semiconductor wafer. Chipping and wafer cracking can occur, resulting in loss of integrated circuit dies that would otherwise yield functional devices.

Figure 4:
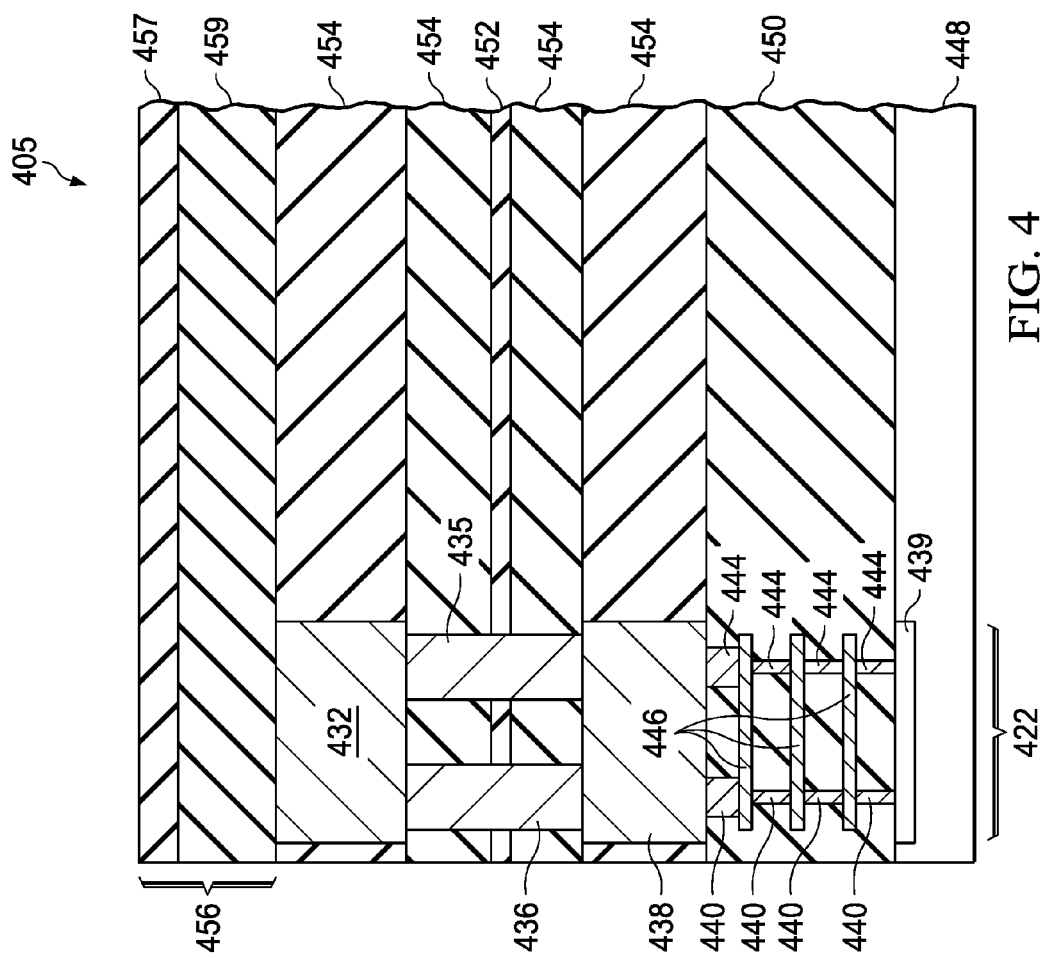
FIG. 4 illustrates in a cross sectional view a portion of a semiconductor wafer.

FIG. 4 depicts in a cross sectional view a portion of a semiconductor wafer 405 including upper level conductor layers and lower level conductor layers such as are used in current semiconductor processes. In FIG. 4, an example structure 422 is shown. In this structure 422, three lower level metal layers 446 are coupled to an active area 439 and to one another by conductive vias 440 and 444 extending through lower level insulator layers. In FIG. 4, two upper level conductor layers 432, 438 are formed in upper level insulator layers 454. These two upper level conductor layers are coupled vertically and electrically to one another by an upper level via layer including vias 435, 436. A passivation layer 456 overlies the structure.

In the structure 422 in FIG. 4, a semiconductor wafer 448 has an active area 439 formed in an upper portion. The active area can be an n-doped or p-doped area such as are used to form transistors. In FIG. 4, the structure 422 shown is a portion of a scribe seal such as such as scribe seals 322 shown in the plan view of FIG. 3. In FIG. 4, those areas that correspond to areas in FIG. 3 are shown with similar reference labels, except that the first digit is now a "4" for convenience. In FIG. 4, the scribe seal 422 is shown to illustrate the various insulator layers, conductor layers and vias used in manufacturing the semiconductor wafer.

Scribe seal 422 includes lower level vias 440 formed between the three lower level conductor layers 446. The lower level vias 440 can be formed using tungsten plugs. Other conductive materials used for vias in semiconductor processes can be used. The vias 440 in scribe seal 422 are trench vias, and the trench vias form a continuous interruption of the insulator layers on one side of an integrated circuit die. In FIG. 4, the active area 439 will be formed simultaneously with the formation of other active areas for the integrated circuit dies formed on the semiconductor wafer. The scribe seal 422 is formed simultaneously with and using the same insulator layers and conductor layers used in the formation of devices within the integrated circuit die 410. In FIG. 4, the lower level conductors 446 can be aluminum. Other metals and alloys can also be used. Aluminum has good adherence to oxides such as silicon oxides that are commonly used for the insulator layers, and has good conductivity/resistance, and is relatively low in cost.

The insulator layers 450 are sometimes referred to by different terms depending on the application and position over the semiconductor substrate. For example, insulator material formed over the active area and prior to any metallization steps can be called "pre-metal dielectric" or "PMD." Insulator layers that are formed surrounding metal layers can be called "inter-level dielectric" or "ILD." Insulator layers that are formed between layers of conductors can be referred to as "inter-metal dielectric" layers or "IMD." Trench vias 440 are shown vertically stacked over and in contact with the active area 439. For purposes of this application, the term "via" includes the opening formed in an insulator layer and also the conductive material that fills the opening to form a vertical physical and electrical connection. In the scribe seal 422, trench vias 440 are used in the portion of the scribe seal closest to the integrated circuit die. The trench vias 440 and the conductor layers they couple together thus form a continuous wall of conductor material that interrupts each of the insulation layers. The use of the scribe seal 442 is an attempt to stop any crack propagating within an insulation layer from the scribe street area 426 from continuing into the integrated circuit die area 410. The lower level conductor layers 446 can be formed of a metal used in semiconductor processes for forming conductors in the "front end of the line" processes. For example, metal layers 446 can be formed of aluminum and aluminum alloys. Aluminum conductors in semiconductor devices can be formed using photolithography, including photoresist deposition, photoresist exposure, photoresist patterning, and etch methods. The trench vias 440 can be formed using conductive via materials typically used in semiconductor processes such as tungsten and its alloys. Other conductive materials can be used. In FIG. 4, the lower level vias 444 can be formed using "stitch" vias. These stitch vias do not form a continuous wall but instead are formed as a number of individual columns that can be round, square or oval shaped and extending through the insulation layer 450. The stitch vias provide physical support to the lower level conductive layers 446.

The insulation layers 450, 452 and 454 are formed using conventional semiconductor processes for dielectrics. These layers can be formed using chemical vapor deposition (CVD), plasma enhanced chemical vapor deposition (PECVD) and can be thermally grown. Tetraethyl orthosilicate (TEOS) can be used. Typically the insulator layers 450, 454, 452 will include oxide layers and nitride layers in different portions, so that selective etching processes can be used. Etch stop layers such as can be formed in addition to and between the layers visible in FIG. 4. Additional films and layers can be included to: assist in etch processing; aid in adhesion; provide barrier layers; provide anti-reflective coatings; and provide backside anti-reflective coatings to improve photolithographic processes. The materials used for the insulator layers can include, without limitation: silicon oxide, silicon nitride, silicon carbide, silicon oxynitride, SiOC, and other films and gel dielectrics. High-k and low-k dielectrics can be included in the insulator layers.

In FIG. 4, the scribe seal 422 also includes upper level layer conductors 432, 438. These can be formed in the "back end of the line" or "BEOL" processes. Copper conductors are used to form upper level metal conductor layers in many semiconductor processes. Copper has a lower resistance than aluminum and may be less prone to electromigration problems. Diffusion barrier materials (not shown for clarity) surround the copper on all sides to prevent copper ion diffusion into surrounding layers or materials. In FIG. 4, the scribe seal 422 includes a first copper conductor 438 and a second copper conductor 432 that is the uppermost upper level layer conductor in this example. In various example semiconductor processes, more or fewer conductor layers can be used, including more or fewer lower level conductor layers and more or fewer upper level conductor layers.

In FIG. 4, the copper conductor layers 432, 438 can be formed using damascene processes in BEOL processing. In damascene processes, the copper is not patterned and etched as the aluminum lower level conductors were. Instead, a metal inlay procedure is used. The insulator layers 452, 454 are patterned to form trenches. Copper seed layer material is sputtered or otherwise deposited. An electroplating process is performed to fill the trenches and to ensure complete filling of the trenches, the electroplating continues above the surface of the trench.

After the electroplating is finished with an "overburden" layer formed above the surface of the trenches, chemical mechanical processing or "CMP" is performed to complete the copper conductor layer and to planarize the upper surface of the layer. In CMP, a chemically active slurry is applied to a polishing pad. The slurry includes abrasive particles. The surface of the semiconductor wafer with the excess electroplated material is applied to the pad in a circular or other motion, and the excess copper material is polished away, leaving a planar trench filled with the planarized copper conductor. Additional insulator layers are formed and vias such as 435 and 436 can be formed between the conductor layers using etch and etch stopping layers of dielectric material. The upper level vias and the overlying trenches can be filled using the electroplating process. In this manner several layers of upper level conductors can be formed.

In the scribe seal 422, the uppermost conductor layer 432 is vertically connected to the layer 438 by a trench via 436. This trench via is formed on the side of the scribe seal 422 closest to the integrated circuit die and continues the vertical wall that is formed interrupting the insulation layers 450, 452, 454. In FIG. 4 an etch stop layer 452 is shown. However, this is but one example arrangement and the insulator layers 454, 450 and 452 can be formed of similar materials or of different materials as described above.

The scribe seal 422 of FIG. 4 also includes a passivation layer 456 that overlies the upper surface of the uppermost conductor layer 432 and can be formed of silicon oxide, silicon nitride, silicon oxynitride and other dielectric materials. In FIG. 4, the uppermost layer of the passivation layer 457 is silicon nitride. The remainder of the passivation layer 459 can be silicon dioxide. The passivation layer 456 forms a protective layer, electrically insulating the conductors and also provides a physical coating to protect the metal conductors and the semiconductor substrate from corrosive elements and moisture. To form bond pads contacting the upper level conductor layer in the integrated circuit dies, openings are formed in the passivation layer 456 by pattern and etch processes.

In an example semiconductor process, the lower level conductor layers 446 are fairly thin, such as about one micron thick or less. However, the upper level copper conductor layers and the upper level copper via layers are each fairly thick, about three microns each, for a total of nine microns of vertical thickness. In a conventional scribe street probe pad, each of the conductor layers including the upper level conductor layers 432, 438 and vias 436 will be present. When a sawing operation is performed this thick copper metal will be in the probe pads as the saw blade traverses the saw kerf lane. The thick metal materials can prevent proper sawing, causing wafer chipping and cracking.

Figure 5:
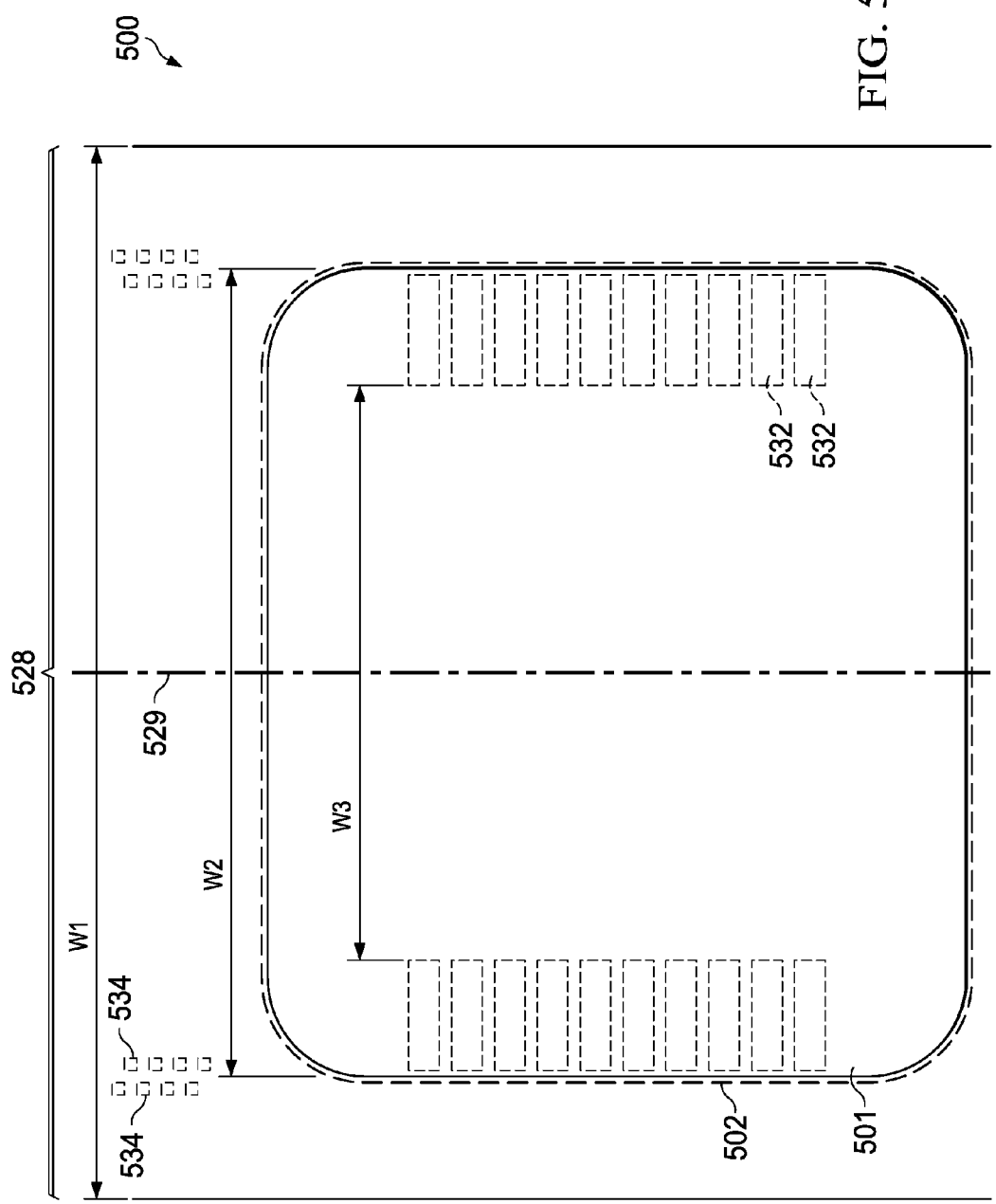
FIG. 5 illustrates in a plan view a scribe street portion of a semiconductor wafer incorporating a probe pad embodiment.

FIG. 5 illustrates in a plan view 500 a portion of a semiconductor wafer incorporating an embodiment. In FIG. 5, for those elements that correspond to elements in FIGS. 3 and 4, similar reference labels are used. However the first digit in the reference label is now a "5" for convenience.

In FIG. 5, a single scribe street 528 is shown with a scribe probe pad 501 positioned in a central portion. The scribe probe pad 501 is formed in an opening 502 made by etching the passivation material. The scribe probe pad 501 includes a conductive material that is deposited in the opening to form the upper surface layer of the probe pad 501. In an example process a combination of tantalum, tantalum nitride, nickel and palladium are used to form a layer of Ta/TaN/Ni/Pd or TaN/Ni/Pd in the opening. Beneath the probe pad surface layer are islands of the uppermost one of the upper level layer conductors 532, shown with dashed lines as the upper level conductor layer 532 lies beneath the upper surface layer of the probe pad 501. A plurality of these islands are formed on either side of, and arranged in a parallel orientation to, the saw kerf lane 529. The saw kerf lane 529 does not intersect any portion of the upper level conductor layer 532. In an example embodiment this layer is formed of a thick damascene copper layer. As will be further described hereinbelow, for probe pads formed away from scribe street intersections, the saw kerf lane 529 does not intersect any portion of the upper level conductor layers or the upper level vias. For a probe pad formed at a scribe street intersection, the saw blade will encounter the probe pad upper level conductor material but the metal coverage is greatly reduced over prior probe pad arrangements.

The upper level conductor layer 532 is formed of columns or islands that can be round, square or oval and which are vertically connected by vias. In the illustrated example, the coverage of the upper level conductor layer in probe pad 501 is less than about ten percent. This coverage percentage is a ratio of the total surface area of the upper level conductor layer material 532 in the probe pad 501 over the total surface area of the probe pad 501.

Dummy areas 534 are shown outside of the probe pad 501. As is known to those of skill in the art, in using CMP processes dummy fill patterns are often added to make the pattern density in a layer to be polished more uniform. These dummy fill areas 534 do not have a function in the circuit but instead improve the planarity of the CMP layers by reducing "dishing" that can occur when a portion of the insulator layer is free from the upper level conductor layer, that is, when the fill pattern is non-uniform. In the embodiments, the central portion of the scribe street is kept free from dummy fill material in the upper level conductor layers, as shown in FIG. 5 no dummy areas 534 are placed in the central portion of the scribe street on either side of the saw kerf lane 529.

In an example semiconductor wafer, the scribe street 528 has a width W1 of about 78 microns. The probe pad width W2 is about 74 microns. The probe pad 501 is shown as a square shape. In an alternative embodiments, the probe pad can be a rectangle having a width W2 as shown in FIG. 5, but having a greater or lesser length. The spacing between the inside edges of the two rows of the copper islands in the example probe pad is about 65 microns, centered about the saw kerf lane 529. The total area of the probe pad in an example embodiment is 74 microns×74 microns, or 5476 square microns.

In an alternative arrangement to that shown in FIG. 5, the upper level conductor layer 532 can include two narrow rails on two edges of the probe pad, aligned with the saw kerf lane 529, instead of being formed in columns or islands. The two narrow rails can also be arranged on either side of the probe pad, adjacent to the outside edges of the probe pad, and arranged in parallel to and spaced from the saw kerf lane 529, and of dimensions such that the total coverage of the upper level conductor layer is less than or equal to about ten percent. In other examples, the coverage could be less than about twenty percent.

In the descriptions of FIGS. 6-13 that follow, individual layers of the probe pad structure of the embodiments are described in a sequence starting with the lowest level conductor layer, including the via layers, and moving to the upper surface of the probe pad.

Figure 6:
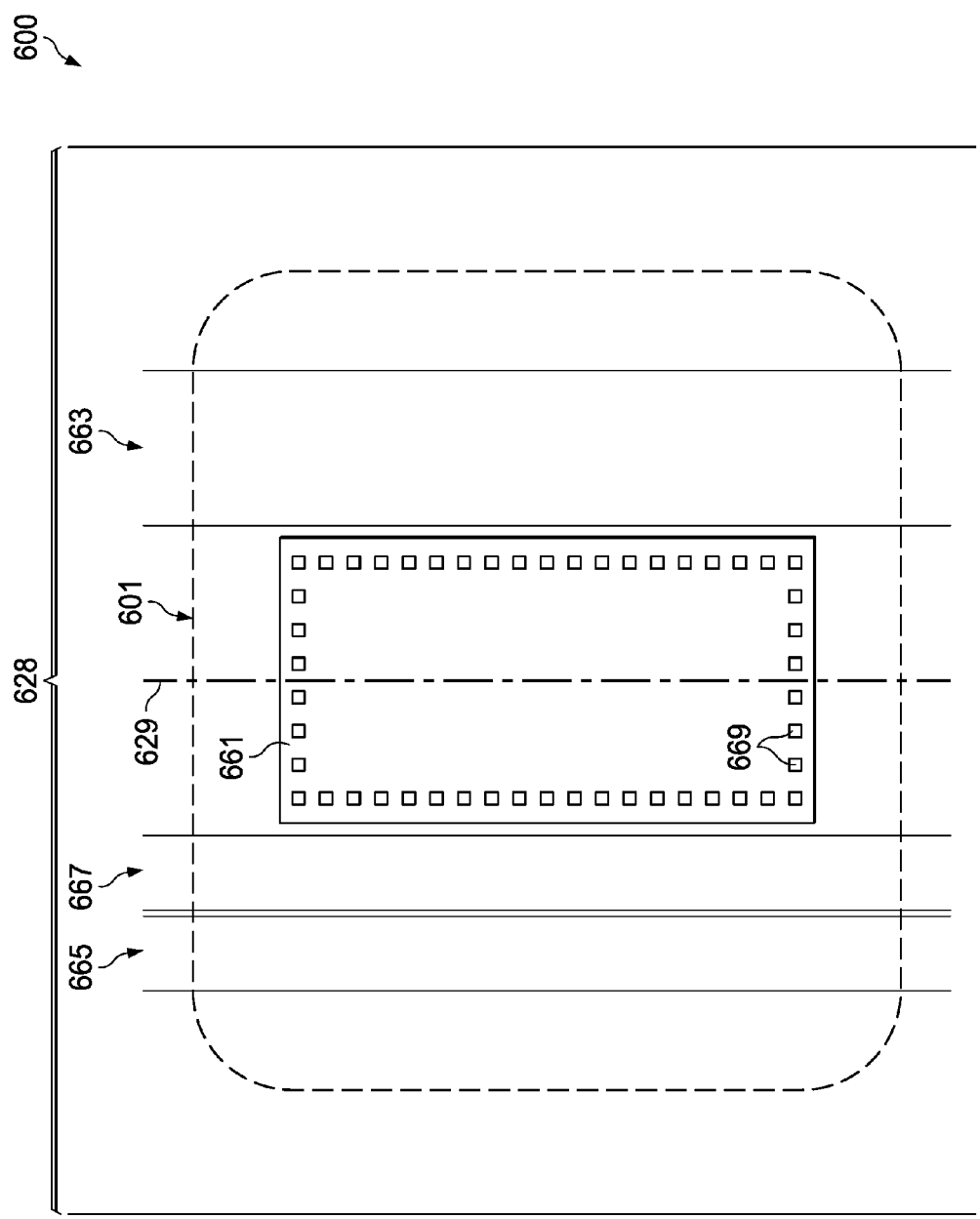
FIG. 6 illustrates in a plan view a first level metal layer portion of a probe pad embodiment.

FIG. 6 illustrates in a plan view 600 a portion of the first level metal layer for a probe pad area 601 over a semiconductor wafer. In FIG. 6, for those elements that correspond to elements in FIGS. 3-5, similar reference labels are used. However the first digit in the reference labels is now a "6" for convenience.

A rectangular pad 661 is formed in a central portion of the probe pad area 601. The pad 661 could have other shapes as well. A first routing portion 663 is shown traversing the probe pad area, and is used to give routing freedom so that signals can be routed through the probe pad area. Similarly, second routing portion 665 and third routing portion 667 are shown traversing the probe pad area 601. The rectangular pad 661 has contacts 669 shown below the first level metal layer. Contacts 669 make electrical contact to an active area (not visible) in the semiconductor wafer, the active area lying beneath the probe pad area 601. In an alternative example, no contacts lie beneath the rectangular pad 661, where no contact to an active area is desired for a particular probe pad.

Figure 7:
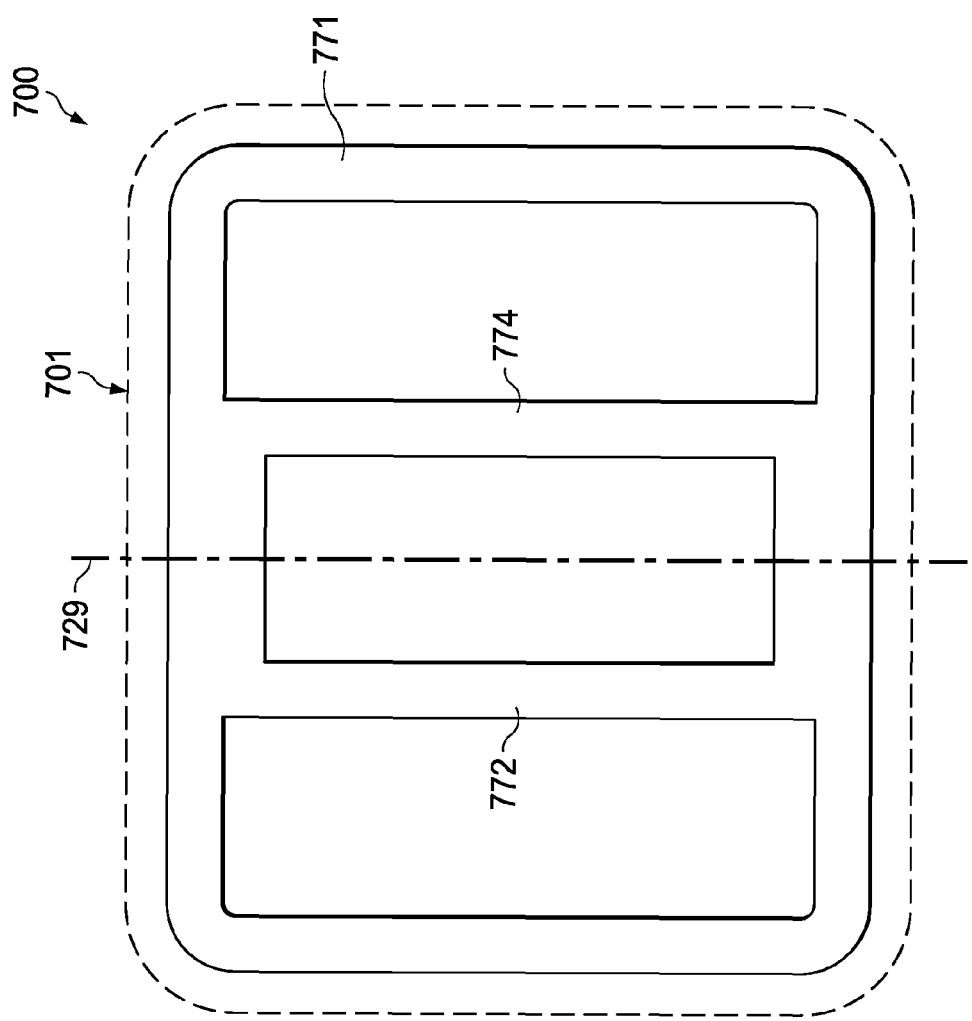
FIG. 7 illustrates in a plan view a lower level conductor frame of a probe pad embodiment.

In FIG. 7, a portion of a lower level conductor layer frame 771 is shown in a plan view 700 of a probe pad area 701. In FIG. 7, for those elements that correspond to elements in FIGS. 3-6, similar reference labels are used. However the first digit in the reference label is now a "7" for convenience.

The conductor frame 771 is used for the second and higher layers of the lower level conductor layers that will correspond to some of the layers 446 in FIG. 4. The frame 771 can be formed of the conductive material used for the lower level conductor layers. In an example semiconductor wafer, the lower level conductor frame 771 can be formed of aluminum. In the embodiments, the lower level metal layers above the first level metal layer shown in FIG. 6 are formed using the frame 771 or a similar pattern in the probe pad area. The frame 771 has a border portion that is coextensive with the probe pad area, and at least two central frame members 772, 774 that will overlie the portions of rectangular pad 661 in FIG. 6, the first level of metal. The lower level conductor frame 771 is of sufficient width to allow for vias to be made below, and above, the conductor layer frame and to provide sufficient surface area for robust electrical connections. The frame 771 is arranged to have open portions to reduce the metal content of the probe pad. The frame 771 has coverage of less than about thirty percent. The coverage is a ratio of the surface area of the frame 771, including the outer frame border and the inner member portions, over the total surface area of the probe pad area 701.

By reducing the metal content of each of the lower level conductor layers, the amount of metal that the saw blade has to cut through when the probe pad area is traversed by the saw blade during dicing is greatly reduced. Although FIG. 7 illustrates one possible pattern for the conductor frame 771, other patterns that have reduced metal coverage can be used with the embodiments. The outer borders of the frame provide an area for vias to be made between the lower level conductor layer and other layers. The inner members 772, 774 provide additional area for vias to connect the lower level conductor layer frame 771 to other layers, including the rectangular pad shown in FIG. 6. The inner members 772, 774 also provide physical support to the lower level conductor frame. In the illustrated example, the lower level conductor frame has a coverage of less than or equal to about thirty percent In other examples the coverage could be greater than thirty percent but still be reduced from a solid conductor layer, and reduce the metal the saw blade has to cut through.

Figure 8:
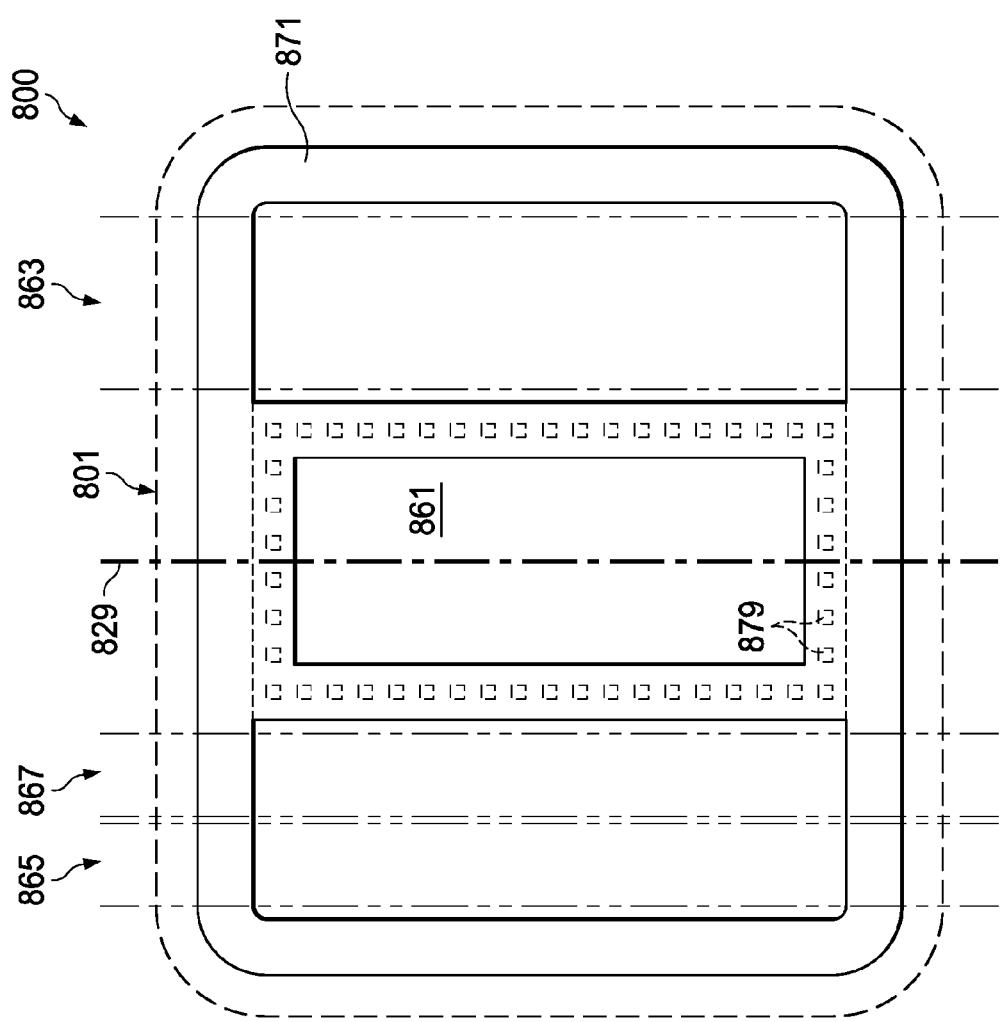
FIG. 8 illustrates in a plan view a lower level conductor frame and vias of a probe pad embodiment.

FIG. 8 depicts in a plan view 800 a portion of a probe pad area 801. In FIG. 8, for those elements that correspond to elements in FIGS. 3-7, similar reference labels are used. However the first digit in the reference label is now an "8" for convenience. In FIG. 8, a lower level conductor frame portion 871 formed on the second level metal layer is shown. The first level metal layer portions are shown below the conductor frame portion 871. The routing portions 865, 867 and 863 are shown in dashed lines because these portions of the first level metal layer lie beneath the second level metal conductor frame 871. The upper surface of rectangular pad 861 is seen through the opening in the central portion of the conductor frame 871. Lower level vias 879 lie beneath the second level metal conductor frame 871 and connect the second level metal conductor frame 871 to the rectangular pad in the first level metal layer 861.

Figure 9:
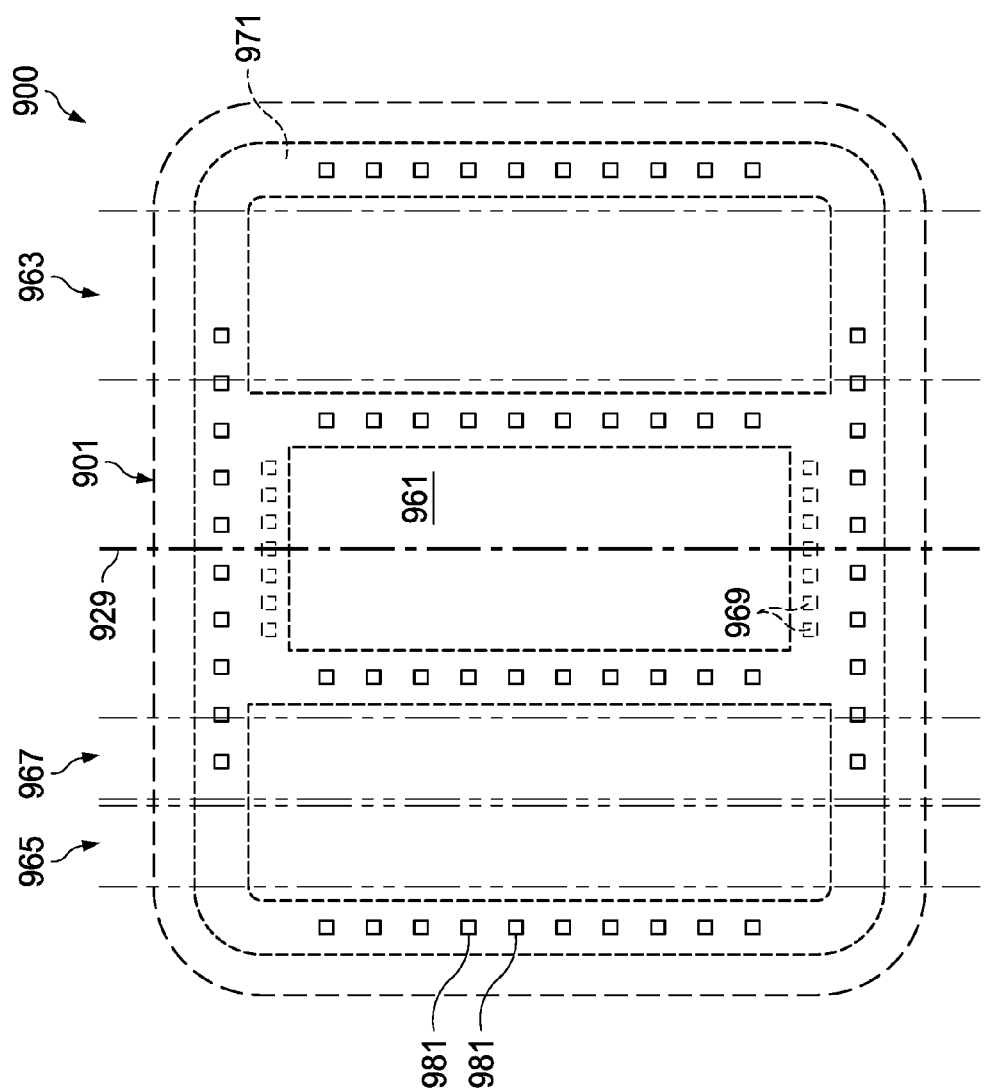
FIG. 9 depicts in a plan view a lower level via layer of a probe pad embodiment.

FIG. 9 depicts in a plan view 900 a portion of a probe pad area 901. In FIG. 9, for those elements that correspond to elements in FIGS. 3-8, similar reference labels are used. However the first digit in the reference label is now a "9" for convenience. In FIG. 9, a lower level via layer 981 is shown. Vias 981 are shown formed over portions of the second level metal conductor frame 971. These vias 981 will connect the second level metal conductor frame 971 to a third level metal conductor frame (not shown in FIG. 9) if used, or alternatively to an upper level conductor layer. The second level metal frame 971 is shown dashed as it lies beneath the lower level via layer 981. The first level metal layer rectangular pad 961 is visible through the open portion of the center of the second level metal frame 971. The first level metal routing portions 965, 967 and 963 are shown dashed as these first level metal portions lie beneath the second level frame 971. The vias 969 are shown dashed as they lie beneath the second level metal frame 971. These vias connect the second level conductor frame 971 to the rectangular pad 961 in the first level metal layer.

Figure 10:
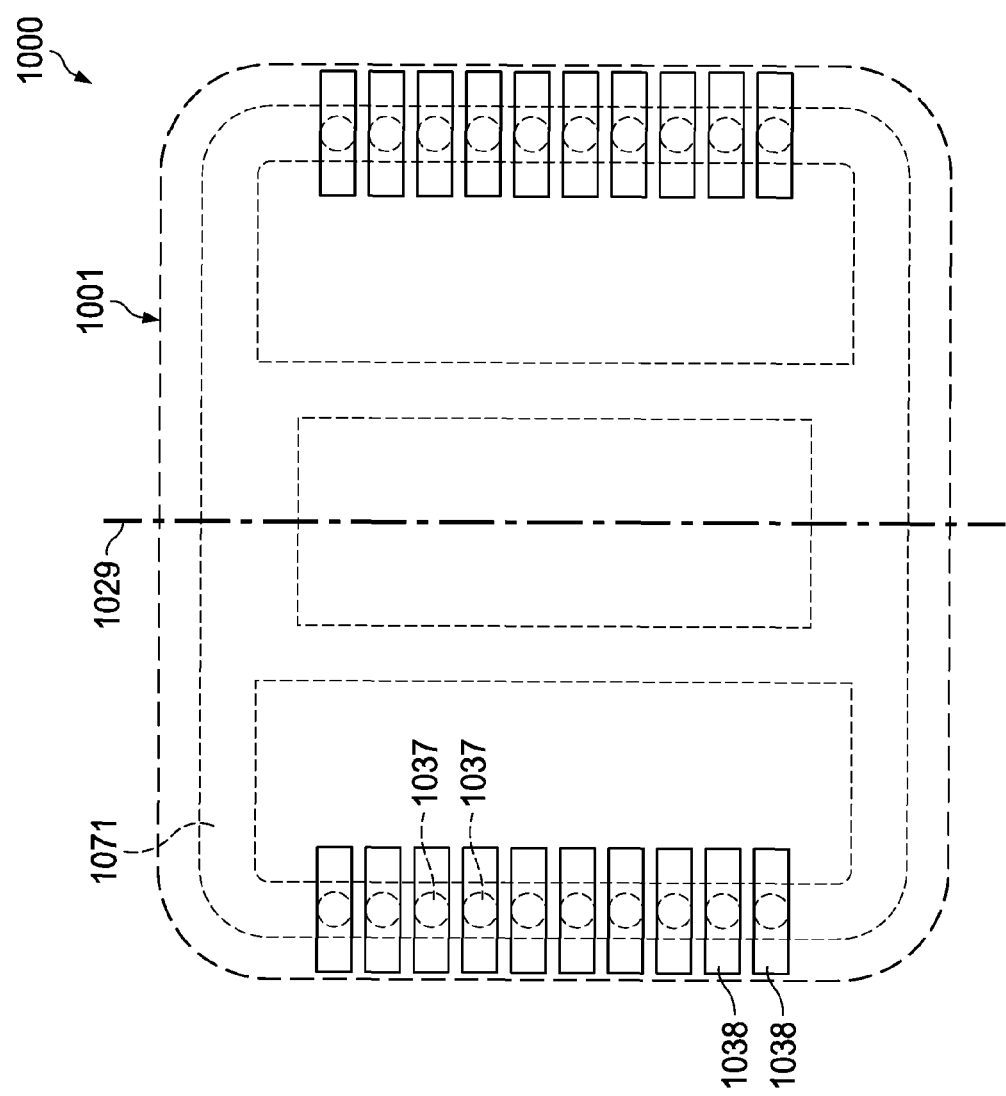
FIG. 10 depicts in a plan view an upper level conductor layer of a probe pad embodiment.

FIG. 10 depicts in another plan view 1000 a portion of a probe pad area 1001. In FIG. 10, for those elements that correspond to elements in FIGS. 3-9, similar reference labels are used. However the first two digits in the reference label are now "10" for convenience. In FIG. 10, an upper level conductor layer 1038 is shown having island portions. The island portions of layer 1038 are arranged along two edges of the outside of the probe pad area, on opposing sides of the saw kerf lane 1029, spaced from and arranged in parallel with the saw kerf lane 1029. The saw kerf lane 1029 does not intersect any portion of the upper level conductor layer 1038. For a probe pad 1001 located at a scribe street intersection, the saw kerf lane will intersect the upper level conductor layer 1038; however the coverage for this layer is less than about 20% so the amount of metal the saw blade will encounter is greatly reduced. Vias 1037 shown in dashed lines lie beneath the islands of the upper level conductor layer 1038 and couple the upper level conductor layer to the lower level metal layer conductors such as frame 1071, shown in dashed lines as it lies beneath the upper level conductor layer 1038. In this example, the surface area of the upper level conductor layer 1038 has a surface area that is less than ten percent of the total surface area of the probe pad area 1001. The coverage of the upper level conductor layer is less than or equal to about ten percent. In other arrangements, the coverage could be greater such as up to about twenty percent.

The island portions of the upper level conductor layer 1038 can be rectangular, circular, or square as shown in this example. In another alternative arrangement, the upper level conductor layer 1038 can be arranged as two narrow rails, positioned at two edges of the probe pad area on opposing sides of and aligned in parallel to the saw kerf lane 1029, so that when the saw blade traverses the saw kerf lane 1029 in a dicing operation, the saw blade does not intercept any portion of the upper level conductor layer 1038.

Figure 11:
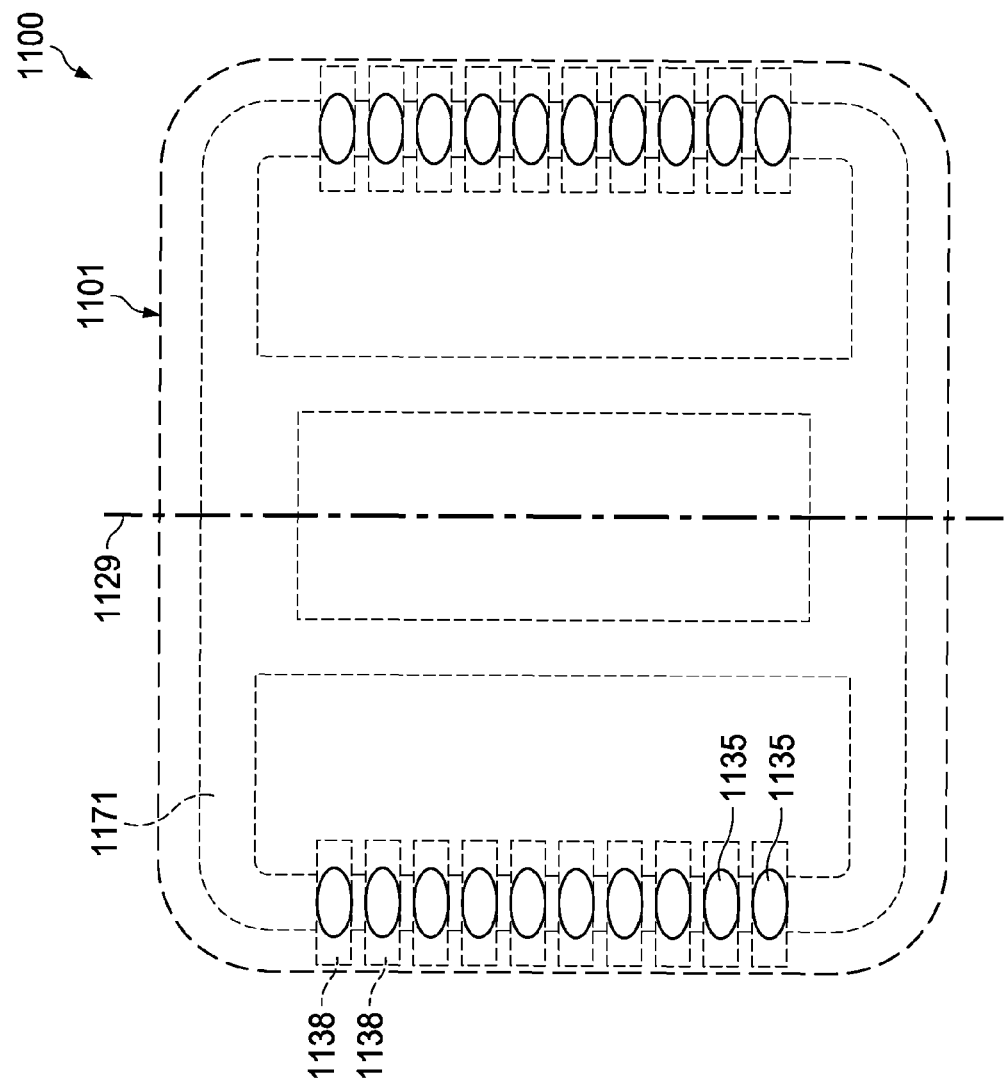
FIG. 11 depicts in another plan view an upper level via layer of a probe pad embodiment.

FIG. 11 depicts in a further plan view 1100 the probe pad portion 1001 at an upper level via level. In FIG. 11, for those elements that correspond to elements in FIGS. 3-10, similar reference labels are used. However the first two digits in the reference label are now "11" for convenience. In FIG. 11, upper level vias 1135 are shown arranged in two outside edge portions of the probe pad area, spaced from, on opposing sides of, and aligned with the saw kerf lane 1129. The upper level vias 1135 are arranged so that when a saw blade traverses the saw kerf lane 1129 during a dicing operation, the saw blade does not intersect any portion of the upper level vias 1135. For a probe pad located at an intersection of scribe streets, the saw kerf lane in one direction will intersect a portion of the upper level conductor layer. However the reduced coverage for this layer will result in very little metal for this layer being cut by the saw blade. The upper level conductor layer islands 1138 such as shown in FIG. 10 are shown underlying the vias 1135. The lower level conductor frame 1171 is shown in dashed lines as it underlies the upper level conductor layer 1138. If the upper level conductor layers are arranged as two narrow rails in an alternative embodiment, instead of as islands as shown in FIG. 10, the upper level vias 1135 in FIG. 11 could also be arranged as trench vias that are coextensive with the two rails. In the example shown in FIG. 11, the upper level via layer 1135 and the upper level conductor layer 1138 that lies underneath the vias form vertical stacked column portions.

Figure 12:
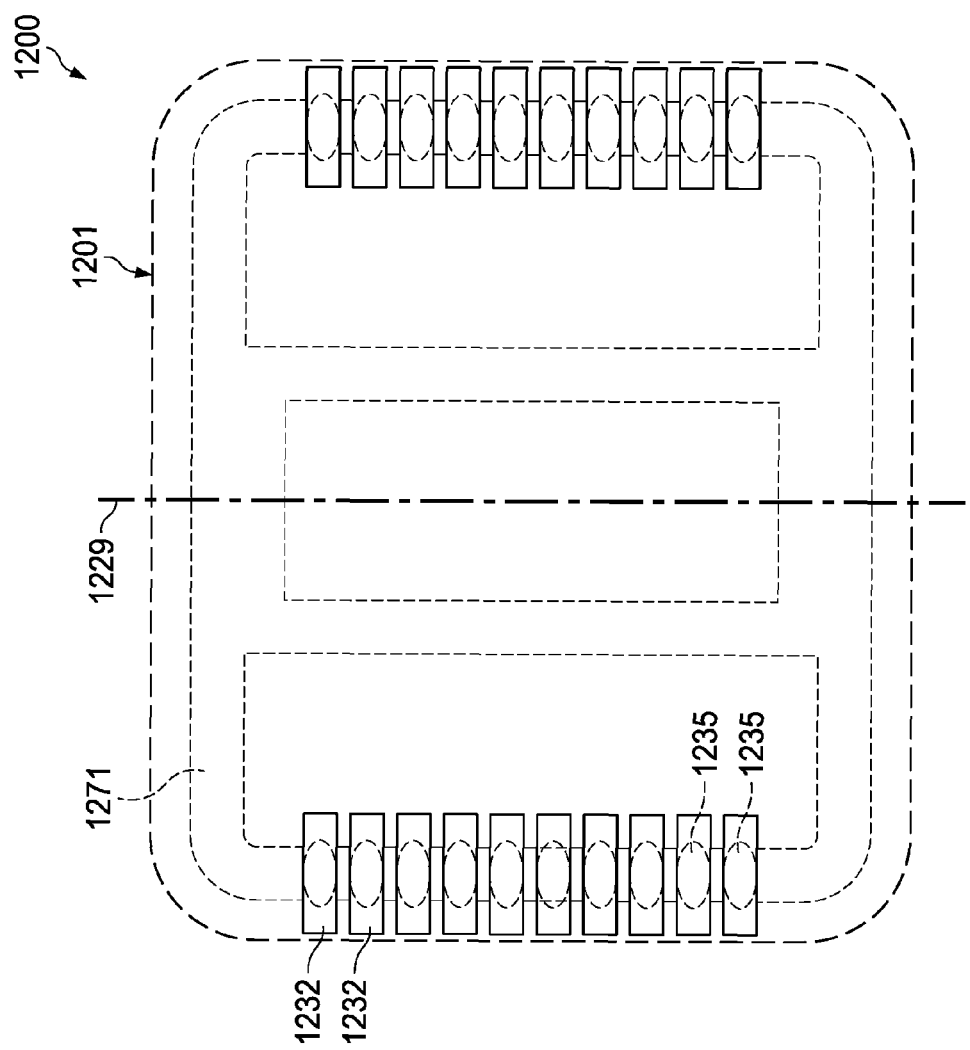
FIG. 12 depicts in a plan view another upper level conductor layer of a probe pad embodiment.

FIG. 12 depicts in a further plan view 1200 a portion of the probe pad area 1201. In FIG. 12, for those elements that correspond to elements in FIGS. 3-11, similar reference labels are used. However the first two digits in the reference label are now "12" for convenience. In FIG. 12, upper level conductor layer 1232 is shown arranged as islands over the upper level via layer of FIG. 11. In FIG. 12, the upper level conductor layer portions 1232 are shown as rectangular or square island portions overlying the upper level vias 1235. The upper level conductor layer 1038 shown in FIG. 10, the upper level via layer 1135 shown in FIG. 11 and the upper level conductor layer 1232 form vertical stacked columns of conductor material. The lower level conductor frame 1271 is shown in dashed lines as it underlies the upper level conductor layers and the upper level vial layers. The saw kerf lane 1229 is shown centered in the probe pad area 1201 and intersecting the lower level conductor frame 1271. The upper level conductor islands 1232 are arranged in two rows along two edges of the probe pad area, and are arranged on opposing sides, spaced from, and aligned with the saw kerf lane 1229. The coverage of upper level conductor layer 1232 is less than or equal to about ten percent. As described hereinabove the coverage is a ratio of the total area of the upper level conductor layer 1232 over the total surface area of the probe pad 1201. Other coverage amounts could be used such as up to less than about twenty percent. The arrangement of the upper level conductor layer 1232 is made so that when dicing, the upper level conductor layer 1232 does not have to be cut through for many probe pads. For probe pads located at scribe street intersections, the amount of upper level conductor metal that has to be cut through is greatly reduced by use of the embodiments.

Figure 13:
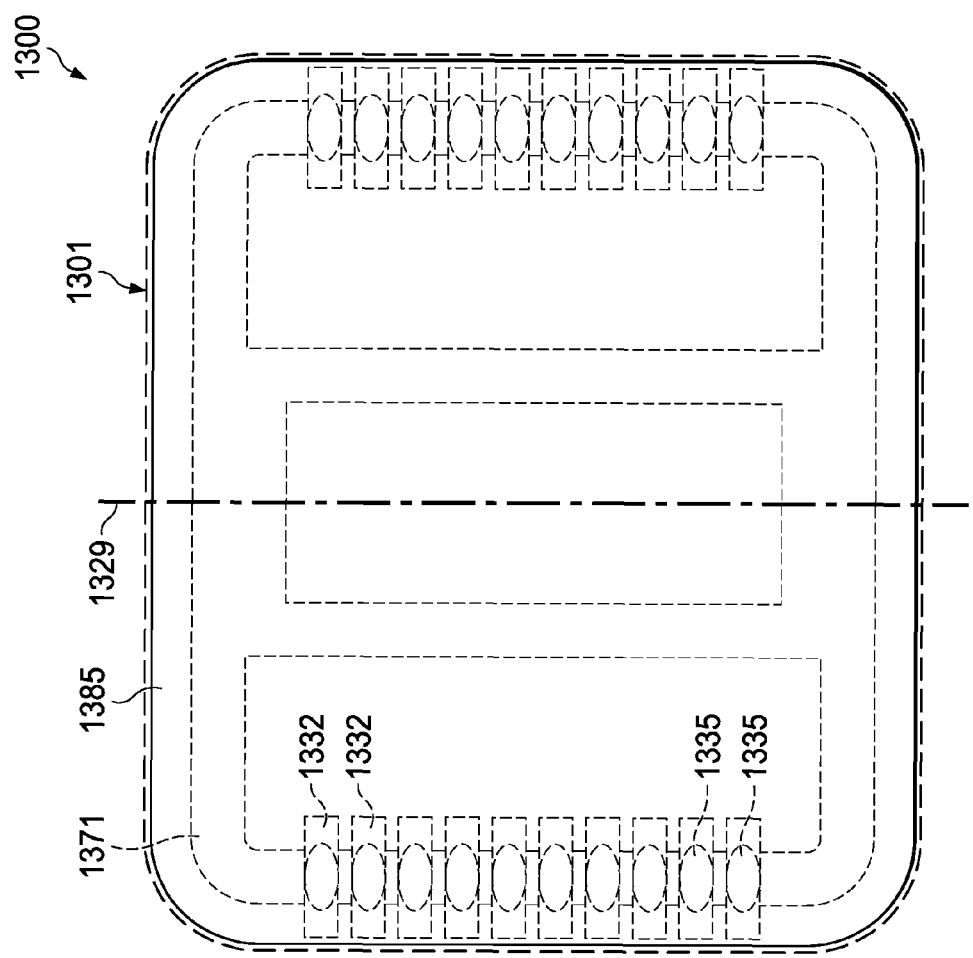
FIG. 13 depicts in a plan view an upper surface layer of a probe pad embodiment.

FIG. 13 illustrates in another plan view 1300 the probe pad area 1301. In FIG. 13, for those elements that correspond to elements in FIGS. 3-12, similar reference labels are used. However the first two digits in the reference label are now "13" for convenience. In FIG. 13, the upper probe pad surface layer 1385 is shown overlying the upper level conductor layer of FIG. 12. This probe pad surface layer 1385 is deposited over an opening formed in the passivation layer (not shown) that is deposited on and overlies the probe pad and the semiconductor wafer after the upper level conductor layers are completed. Patterning and dielectric etch processes are used to form these openings. The opening in the passivation layer in the scribe line forms the probe pad area. Other similar openings over the integrated circuit dies can form bond wire bonding pads. The opening is then coated with a barrier material that covers the upper surface of the upper level conductor layer. Since the upper level conductor layer 1332 in an example semiconductor process is copper, a suitable barrier layer is tantalum/tantalum nitride, which acts a diffusion barrier for copper. Other barrier layers can be used. Additional layers of nickel and palladium provide a conductive finish layer that is resistant to corrosion and pitting and which further provides a diffusion barrier for copper. Thus in one example the upper probe pad surface layer is tantalum, tantalum nitride, nickel, and palladium, Ta/TaN/Ni/Pd or simply TaN/Ni/Pd. Alternative materials for the upper probe pad surface layer include gold, palladium, nickel, titanium and combinations of these layers such as electroless nickel immersion gold (ENIG) and electroless nickel, electroless palladium, immersion gold (ENEPIG) layers that are suitable for wire bonding.

In FIG. 13, the upper probe pad surface layer 1385 overlies the islands of the upper conductor layer 1332. The upper level vias 1335 and the first upper level conductor layer 1338 are shown as lying beneath the upper level conductor layer 1332. The lower level conductor frame 1371 is shown in dashed lines as it lies beneath the upper level conductor layers and the upper level via layer.

The saw kerf line 1329 intersects the probe pad area and intersects the upper probe pad surface layer 1385. When a saw blade traverses the saw kerf lane 1329 in a dicing operation, the saw blade will cut through the upper probe pad surface layer 1385. However, this upper probe pad surface layer 1385 is a few microns thick or less, and so does not contribute to wafer cracking problems observed when sawing through thicker conductor layers.

Figure 14:
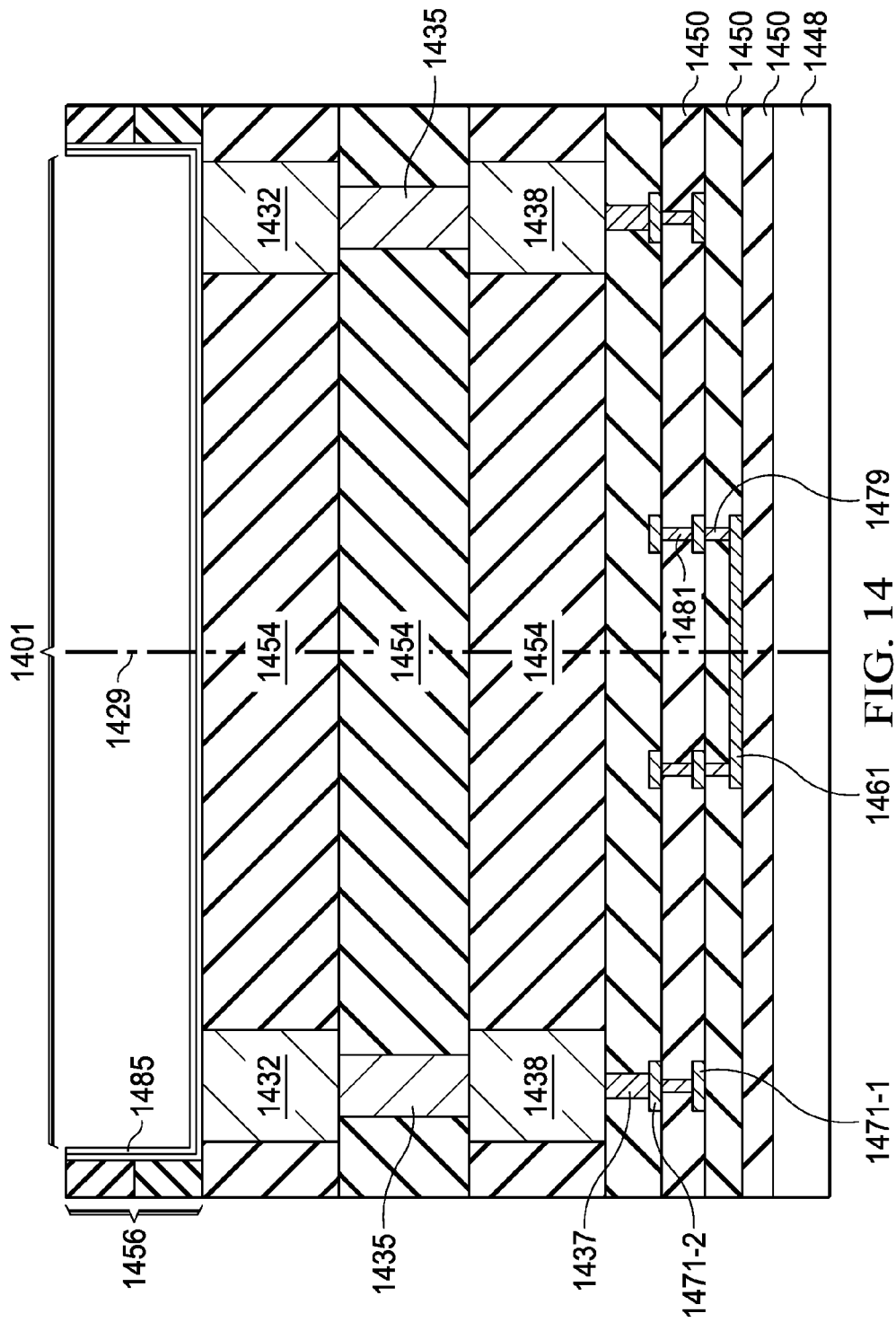
FIG. 14 depicts in a cross-sectional view a probe pad embodiment.

FIG. 14 illustrates in a cross sectional view a probe pad embodiment 1401. In FIG. 14, for those elements that correspond to elements in FIGS. 3-13, similar reference labels are used. However the first two digits in the reference label are now a "14" for convenience.

In FIG. 14, a portion of a semiconductor wafer 1448 is shown. Semiconductor wafers that can be used with the embodiments include silicon, silicon germanium, gallium arsenide and other III-V semiconductor materials. The semiconductor wafer material is brittle and subject to chipping when sawed during wafer dicing.

In FIG. 14, a lower level conductor layer or first level metal layer 1461 is shown in cross section, this layer corresponds to the rectangular pad portion 661 shown in a plan view in FIG. 6. The lower level conductor layers can be formed from aluminum and aluminum alloys, for example, using photolithographic processing including photomasks, photoresist, exposure, development, pattern and etch steps. The aluminum layers for the lower level conductor layers can be around 1 micron thick. Other thicknesses can be used, In FIG. 14, additional lower level conductors are formed in insulator layers 1450. Vias are formed connecting the lower level conductors. The vias can be tungsten or tungsten alloys and can form vertical connections and electrical conductors that couple the lower level conductor layers. In FIG. 14, vias 1479 correspond to the vias shown in a plan view in FIG. 8 and connect the rectangular pad 1461 in the first level metal to the lower level conductor frame of the second level metal shown in the plan view of FIG. 8.

Continuing to refer to the cross section in FIG. 14, the second and third level conductor layers also include two frame portions 1471-1, and 1471-2. These are the second level metal and third level metal layers for the probe pad 1401, and correspond to the frame portion 771 shown in a plan view in FIG. 7, and the subsequent figures, above.

In FIG. 14, via level 1481 connects the second level metal layer, frame portion 1471-1, to the third level metal layer, frame portion 1471-2. These vias correspond to the vias 981 shown in the plan view of FIG. 9 hereinabove. The insulator layers 1450 surround and lie between the first, second and third metal layers 1461, 1471-1, 1471-2, to complete the lower level conductor layers for the probe pad 1401.

In FIG. 14, the via layer 1437 connects vertically between the lower level conductor layers and the upper level conductor layers and corresponds to the vias 1037 shown in the plan view of FIG. 10. Note that the vias shown in the figures are merely illustrative and are drawn relatively larger than would be seen in a practical device. This is done for clarity of illustration, the drawings are not to scale. Also only a few representative vias are shown in each via layer, in a practical device many more would be used to reduce electrical resistance, improve reliability, and to provide additional mechanical support for the conductor layers.

In FIG. 14, upper level conductor layer 1438 is the first damascene metal layer and corresponds to the plan view of the islands of upper level conductor layer 1039 shown in FIG. 10. The upper level conductor layers and upper level vias are arranged at two sides or edges of the probe pad 1401 and are spaced apart from and on opposite sides of the saw kerf lane 1429. When a saw blade traverses the saw kerf lane 1429, the saw blade will not intersect the upper level conductor layers or the upper level vias. For a probe pad located at a scribe street intersection, the saw blade will intersect the upper level conductor layer. The coverage amount for the embodiment probe pads is less than twenty percent so the amount of metal the saw blade has to cut through is greatly reduced over prior probe pads.

In FIG. 14, upper level vias 1435 correspond to the upper level vias shown in a plan view in FIG. 11. These upper level vias can be formed in the same damascene process using either a via first or via last dielectric etch process to pattern layers 1454 surround and lie between the upper level conductor layers. Alternatively the via level can be formed separately in a single damascene process. Upper level conductor layer 1432 corresponds to the upper level conductor layer islands 1232 shown in a plan view in FIG. 12. These upper level conductor portions can be formed using a damascene process with CMP.

In FIG. 14, a passivation layer 1456 is shown formed over the upper level conductor layer 1432. The passivation layer 1456 can include a silicon dioxide layer 1459 with a silicon nitride layer 1457 overlying the silicon oxide layer.

An opening in the passivation layer 1456 defines the area for probe pad 1401. This opening is formed simultaneously with openings in the passivation layer 1456 over integrated circuit dies elsewhere on the semiconductor wafer, to form bond pad openings. After the opening 1456 is formed using dielectric pattern and etch processes, the upper surface layer of the probe pad 1485 is formed by deposition. This layer corresponds to the layer 1385 shown in a plan view in FIG. 13. As described hereinabove, this upper probe pad surface layer can be formed as a barrier layer such as tantalum and tantalum nitride followed with additional layers of nickel and palladium. Other suitable conductive layers including gold, platinum, titanium and combinations of these layers can be used. The upper probe pad surface layer is conductive and resistant to diffusion and corrosion. The upper probe pad layer 1485 can be sputter deposited and then the conductor material on top of the passivation layer 1456 can be removed through a CMP process. The bond pad top conductor can be relatively thin in thickness compared to the underlying conductor layers.

In FIG. 14, saw kerf lane 1429 intersects probe pad 1401. In a dicing operation a saw blade will cut through the semiconductor wafer 1448 and all of the layers up to and through the upper probe pad surface layer 1485. Due to the arrangements of the embodiments, however, the saw blade will not cut through any portion of the upper level conductors 1432, 1435, 1438 for most probe pads. The saw blade will cut through small portions of the lower level conductor frames 1471-1, 1471-2 and the rectangular first level metal pad 1461. These layers are fairly thin when compared to the much thicker upper level conductor layers. By greatly reducing the metal thickness the saw blade must cut through to dice the wafer, the chipping problems observed in the conventional scribe street probe pad areas are eliminated or greatly reduced due to the use of the embodiments.

In the illustrated examples, the coverage of the upper level conductor layers is less than or equal to about ten percent up to less than about twenty percent. In the illustrated examples, the coverage of the lower level conductor layers is less than or equal to about thirty percent for the second and higher lower level conductor layers. Other coverage amounts can be used.

The number of lower level conductor layers and upper level conductor layers shown in the illustrative examples does not limit the number of conductor layers that can be used in an embodiment. For example, while three lower level metal layers were shown in the figures, additional lower level metal layers can be used. In other arrangements, fewer lower level metal layers can be used. Similarly, while only two upper level conductor layers are shown in the figures, more upper level conductor layers, or fewer, can be used. As described hereinabove, while the upper level conductor layers and upper level vias described herein are shown as pillars or columns, narrow rails can be used for the upper level conductor portions. Trench vias or stitch vias can be used to vertically couple the upper level conductor layers.

Figure 15:
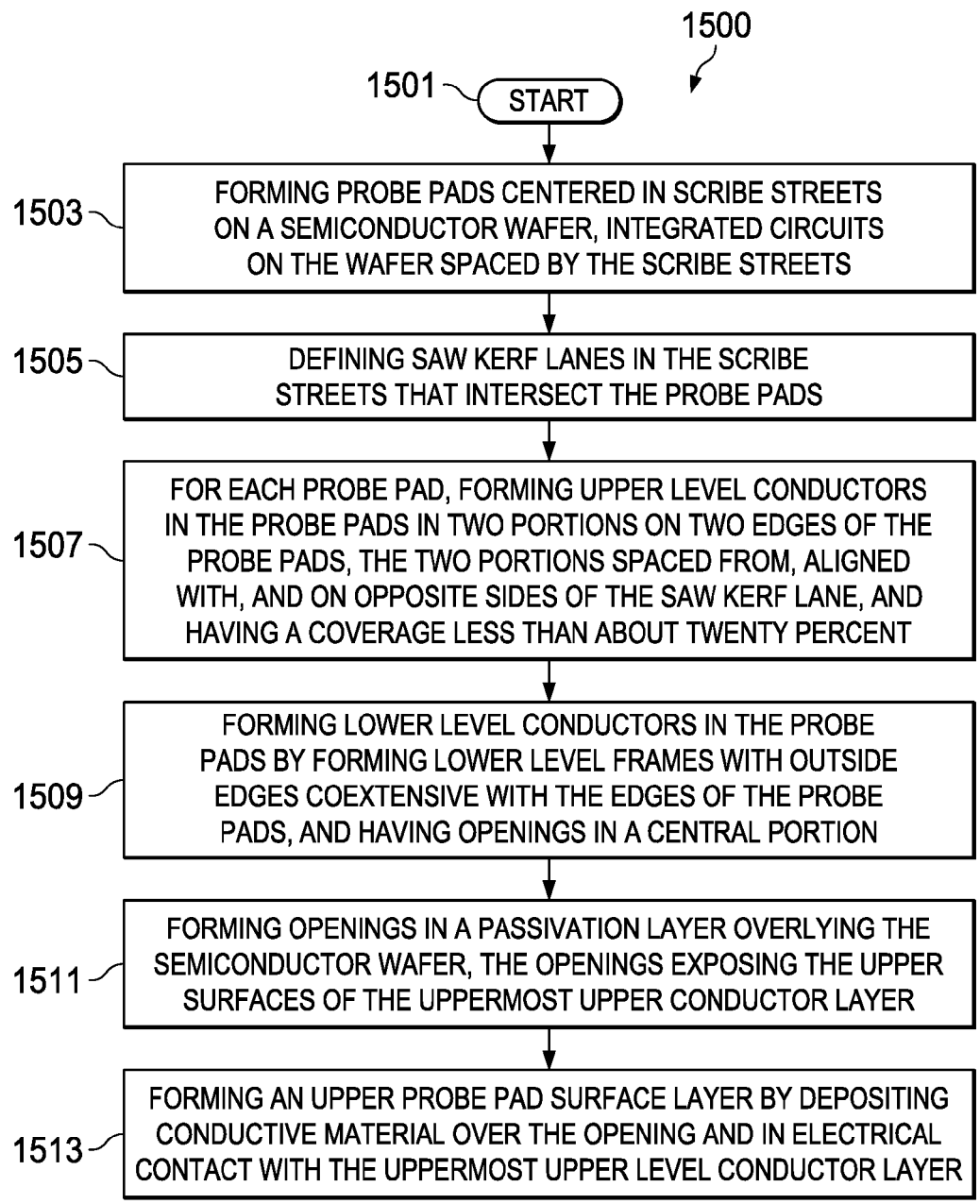
FIG. 15 illustrates in a flow diagram a method embodiment.

FIG. 15 depicts in a flow diagram an example method embodiment 1500. In the method illustrated in FIG. 15, the method begins at step 1501, Start. At step 1503, probe pads are formed centered in scribe streets on a semiconductor wafer, integrated circuits on the wafer spaced by the scribe streets.

At step 1505, saw kerf lanes are defined in the scribe streets that intersect the probe pads.

At step 1507, for each of the probe pads, the method continues by forming upper level conductors in two portions on two edges of the probe pads, the two portions spaced from, aligned with and on opposite sides of the saw kerf lane. The upper level conductor layer has coverage of less than about twenty percent.

At step 1509, lower level conductors are formed in the probe pads by forming lower level frames with outside edges coextensive with the edges of the probe pads, and having openings in a central portion.

At step 1511, openings are formed in a passivation layer that overlies the semiconductor wafer, the opening exposing the upper surfaces of the uppermost upper level conductor layer.

At step 1513, an upper probe pad surface is formed by depositing conductive material over the opening. The conductive material is in electrical contact with the uppermost upper level conductor layer.

The method steps shown in FIG. 15 illustrate one possible order of steps. However, the order of steps is merely illustrative and can be modified to form an alternative embodiments. For example, the steps 1503, 1505, and 1507 can be performed simultaneously instead of in the order shown in FIG. 15. These modifications form additional embodiment that are within the scope of the appended claims.

Example embodiments and arrangements include a semiconductor wafer with a plurality of scribe streets arranged in rows and columns on the surface of the semiconductor wafer, and having saw kerf lanes defined in a central portion and running parallel with the scribe streets; a plurality of probe pads each formed centered in the scribe streets and intersected by the saw kerf lanes. Each probe pad further includes a plurality of lower level conductor layers arranged in lower level conductor frames each having an outside border portion coextensive with the outside edge of the probe pad and each having openings in a center portion; a plurality of lower level insulator layers between the lower level conductor layers and surrounding the lower level conductor layers; a plurality of lower level vias extending vertically through the lower level insulator layers and electrically coupling the lower level conductor frames to one another; a plurality of upper level conductor layers, each forming two portions of upper level conductor layer material on two outer edges of the probe pad, the two portions aligned with, spaced from, and on opposite sides of the saw kerf lane, the coverage of the upper level conductor layers being less than about twenty percent; a plurality of upper level insulator layers between and surrounding the upper level conductor layers; and a plurality of upper level vias extending vertically through the upper level insulator layers and coupling the upper level conductor layers electrically to one another and to the lower level conductor layers.

In another example, for ones of the plurality of probe pads located in the scribe streets but not at an intersection of the scribe streets, the saw kerf lane does not intersect any portion of an upper level conductor layer. In a further example, the semiconductor wafer includes a passivation layer overlying the top surface of the semiconductor wafer; an opening in the passivation layer coextensive with the probe pad; and an upper surface layer covering the surface of the opening in the probe pad, including a conductive layer deposited in the opening and covering the uppermost surface of the upper conductive layer. In still another example, the coverage of the upper level conductor layer is less than about twenty percent.

In a further example, the upper level conductor layers further include copper. In still another example the upper level conductor layers are arranged as islands of upper level conductor material. In a further example the upper level conductor layers and the upper level vias form columns of upper level conductor material extending vertically through the upper level insulator material. In yet another example the upper level conductor layers are arranged as rows of upper level conductor material. In still a further example, in the semiconductor wafer the lower level conductor layers further include aluminum.

In yet a further example, the lower level conductor layers have a coverage that is less than or equal to about thirty percent. In still another example the semiconductor wafer further includes a first level conductor layer formed overlying the semiconductor wafer and formed below the lower level conductor layers, the first level conductor layer forming a rectangular pad region located in a central portion of the probe pad.

In still another example, in the semiconductor wafer including members of the lower level conductor frames across the open central portion, and vias connecting the member portion of a lower level conductor frame to the rectangular pad region of the first level conductor layer.

In yet another example, the semiconductor wafer includes contacts between the rectangular pad in the first level conductor layer and an active area in the semiconductor wafer.

In another example embodiment, a probe pad includes a saw kerf lane centered in a scribe street including the probe pad, the saw kerf lane intersecting the probe pad in one direction; a plurality of lower level conductor layers arranged in lower level conductor frames each having an outside border portion coextensive with the outside edge of the probe pad and each having openings in a center portion; a plurality of lower level insulator layers between the lower level conductor layers and surrounding the lower level conductor layers; a plurality of lower level vias extending vertically through the lower level insulator layers and electrically coupling the lower level conductor frames to one another; a plurality of upper level conductor layers, each forming two portions of upper level conductor layer material on two outer edges of the probe pad, the two portions aligned with, spaced from, and on opposite sides of the saw kerf lane, the coverage of the upper level conductor layers being less than about twenty percent. The probe pad includes a plurality of upper level insulator layers between and surrounding the upper level conductor layers; a plurality of upper level vias extending vertically through the upper level insulator layers and coupling the upper level conductor layers electrically to one another and to the lower level conductor layers; and a probe pad upper surface layer deposited in an opening in a passivation layer formed over the scribe street, the probe pad upper surface layer covering the probe pad and in electrical contact with upper surface of the uppermost upper level conductor layer.

In yet another example, in the probe pad, the saw kerf lane does not intersect any portion of the upper level conductor layers. In still another example the probe pad in which the upper level conductor layer coverage is less than about ten percent. In yet another example, the probe pad includes the upper level conductor layer which includes copper. In still another example, the probe pad in which the upper level conductor layers include island portions arranged in the two portions.

In an example method, the method includes forming probe pads centered in scribe streets over a semiconductor wafer, the scribe streets formed between integrated circuit dies arranged in rows and columns and separated from one another by the scribe streets; defining saw kerf lanes centered in the scribe streets that intersect the probe pads; forming upper level conductors in the probe pads in two portions at two edges of the probe pads, the two portions spaced from, aligned with, and on opposite sides of the saw kerf lanes, the coverage of the upper level conductors being less than twenty percent; forming lower level conductors in the probe pads underlying the upper level conductors, the lower level conductors forming lower level frames with outside edges coextensive with the outside edges of the probe pads, and having openings in central portions of the lower level frames; forming lower level vias extending through lower level insulator layers between the lower level conductors that electrically connect the lower level frames; forming upper level vias extending through upper level insulator layers between the upper level conductors and electrically connecting the upper level conductor layers to one another and to the lower level conductors; forming an opening in a passivation layer covering the probe pads and the scribe streets, the opening exposing the upper surfaces of the uppermost upper level conductor in the probe pads; and forming an upper probe pad surface layer by depositing a conductive material over the opening and in electrical contact with the uppermost upper level conductor.

In still another method, the method includes dicing the semiconductor wafer by cutting through the probe pads and the semiconductor wafer along the saw kerf lanes, the saw having a blade traversing the saw kerf lane so that for probe pads located away from scribe street intersections, the saw blade never intersects the upper level conductor layers.

In a further example method, the method includes forming the upper level conductors in two portions, including forming island of upper level conductor material in rows spaced from one another. In yet another example, the method includes forming upper level vias extending through the upper level insulators and forming columns of upper level conductor material, the columns including at least a first layer of upper level conductor material, an upper level via, and a second layer of upper level conductor material, physically stacked to form a vertical column.

In another example method, the method includes forming the upper level conductors in two portions including forming narrow rails of upper level conductor material. In still another example, the method includes forming upper level vias connecting a rail of a first layer of upper level conductor material to a rail of a second layer of upper level conductor material located above the first rail of upper level conductor material, In another example method, the coverage of the upper level conductor material is less than or equal to about ten percent. In still a further example method, the coverage of the lower level conductor material is less than or equal to about thirty percent.

Modifications are possible in the described embodiments, and other embodiments are possible within the scope of the claims.

What is claimed is:

1. A method, comprising:
   forming probe pads centered in scribe streets over a semiconductor wafer, the scribe streets formed between integrated circuit dies arranged in rows and columns and separated from one another by the scribe streets;
   defining saw kerf lanes centered in the scribe streets that intersect a central portion of the probe pads;
   forming upper level conductors in the probe pads in two portions at two edges of the probe pads, the two portions spaced from, aligned with, and on opposite sides of the saw kerf lanes, the coverage of the upper level conductors being less than twenty percent;
   forming lower level conductors in the probe pads underlying the upper level conductors, the lower level conductors forming lower level frames with outside edges coextensive with the outside edges of the probe pads, and having openings in central portions of the lower level frames;
   forming lower level vias extending through lower level insulator layers between the lower level conductors that electrically connect the lower level frames;
   forming upper level vias extending through upper level insulator layers between the upper level conductors and electrically connecting the upper level conductor layers to one another and to the lower level conductors;
   forming an opening in a passivation layer covering the probe pads and the scribe streets, the opening exposing the upper surfaces of the uppermost upper level conductor in the probe pads; and
   forming an upper probe pad surface layer by depositing a conductive material over the opening and in electrical contact with the uppermost upper level conductor.

2. The method of claim 1 and further including: sawing through the semiconductor wafer along the saw kerf lane while the saw blade does not intersect any portion of the upper level conductor layers for probe pads located away from intersections in the scribe streets.

3. The method of claim 1, in which forming the upper level conductors in two portions includes forming islands of upper level conductor material in rows spaced from one another.

4. The method of claim 3, in which forming upper level vias extending through the upper level insulator layers includes forming columns of upper level conductor and upper level via material, the columns including at least a first level of upper level conductor material, an upper level via, and a second level of upper level conductor material, physically stacked to form a vertical column.

5. The method of claim 1, in which forming the upper level conductors in two portions includes forming narrow rails of upper level conductor material.

6. The method of claim 5, in which forming the upper level vias extending through the upper level insulator layers includes forming vias connecting a rail of a first level of upper level conductor material to a rail of a second level of upper level conductor material located above the first rail of upper level conductor material.

7. The method of claim 1, in which the coverage of the upper level conductor material is less than or equal to ten percent.

8. The method of claim 1, in which the coverage of the lower level conductor is less than or equal to about thirty percent.

* * * * *